United States Patent [19]
Wada

[11] Patent Number: 5,502,398
[45] Date of Patent: Mar. 26, 1996

[54] SEMICONDUCTOR DEVICE BURN-IN APPARATUS

[75] Inventor: Shinobu Wada, Yokohama, Japan

[73] Assignee: Kabushiki Kaisha Toshiba, Kawasaki, Japan

[21] Appl. No.: 306,311

[22] Filed: Sep. 15, 1994

[30] Foreign Application Priority Data

Sep. 17, 1993 [JP] Japan .................................. 5-231224

[51] Int. Cl.⁶ ........................................................ G01R 31/02
[52] U.S. Cl. ........................... 324/760; 324/419; 324/537; 437/8
[58] Field of Search ................................. 324/760, 419, 324/537; 437/8; 62/259.2

[56] References Cited

U.S. PATENT DOCUMENTS

| | | | |
|---|---|---|---|
| 3,560,849 | 2/1971 | Ryan et al. | 324/419 |
| 3,761,808 | 9/1973 | Ryan | 324/536 |
| 4,716,124 | 12/1987 | Yerman et al. | 437/8 |
| 4,745,354 | 5/1988 | Fraser | 62/259.2 |
| 4,779,047 | 10/1988 | Selstad et al. | 324/760 |
| 4,956,605 | 9/1990 | Biekford et al. | 324/760 |

FOREIGN PATENT DOCUMENTS

| | | |
|---|---|---|
| 61-185949 | 8/1986 | Japan . |
| 2-45949 | 2/1990 | Japan . |
| 2-266275 | 10/1990 | Japan . |
| 4-130279 | 5/1992 | Japan . |

*Primary Examiner*—Kenneth A. Wieder
*Assistant Examiner*—Kourosh Cyrus Khosravi
*Attorney, Agent, or Firm*—Oblon, Spivak, McClelland, Maier & Neustadt

[57] ABSTRACT

In a semiconductor device burn-in apparatus, a film on which a plurality of TAB products, each having a semiconductor device thereon, are arranged in succession and a flexible tape-like wiring board which is situated in the same plane as, and in parallel to, the film and on which electrically conductive wiring patterns are formed are detachably clamped by sockets, in units of one of the TAB products. The film and the wiring board are electrically connected by a wiring board provided on each socket. The film, wiring board and socket are stored in a storage member as a combined structure having an elongated shape, and the combined structure is subjected to a burn-in process.

3 Claims, 3 Drawing Sheets

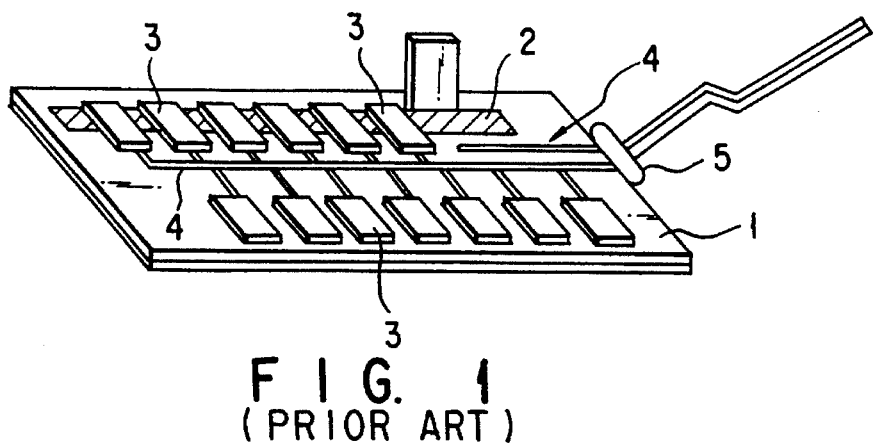
FIG. 1
(PRIOR ART)
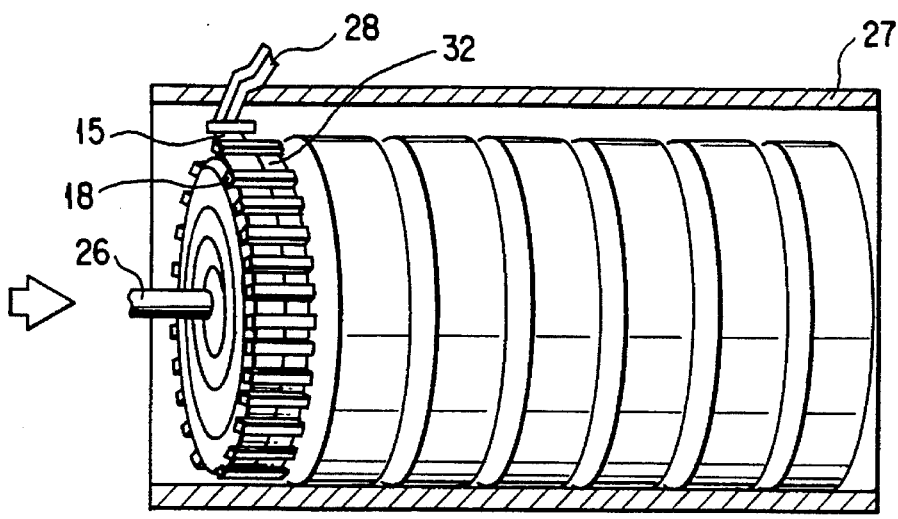
FIG. 2
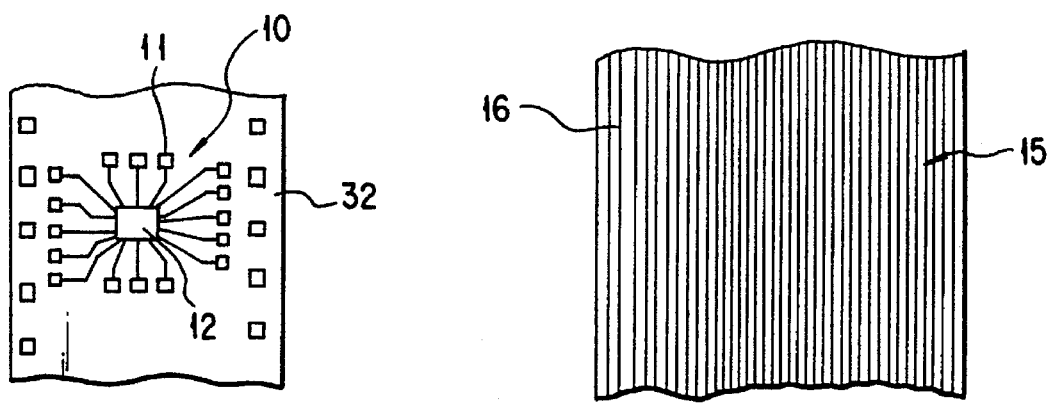
FIG. 3
FIG. 4

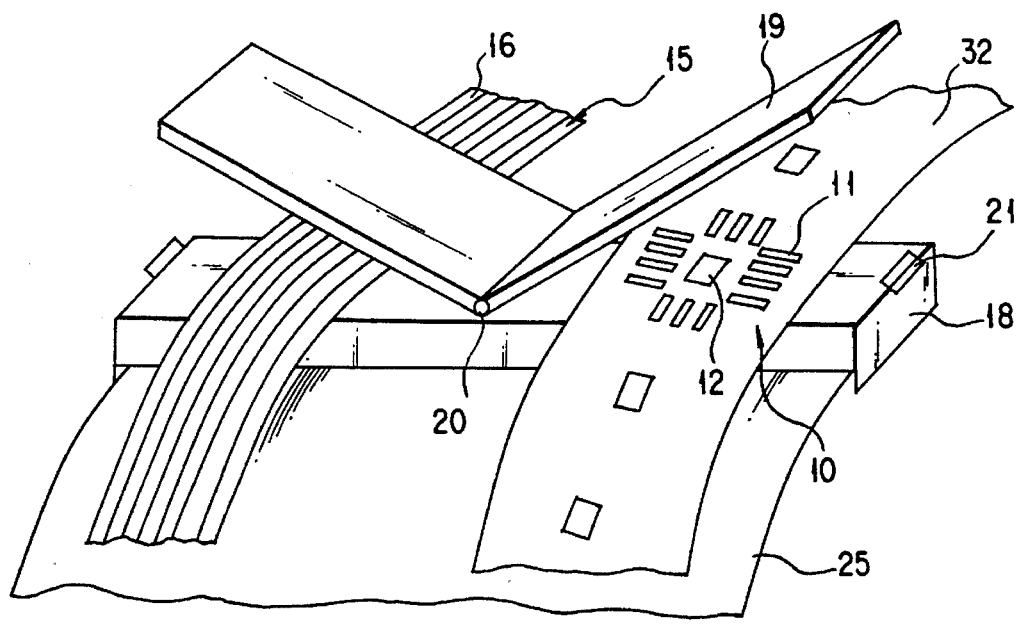
F I G. 8
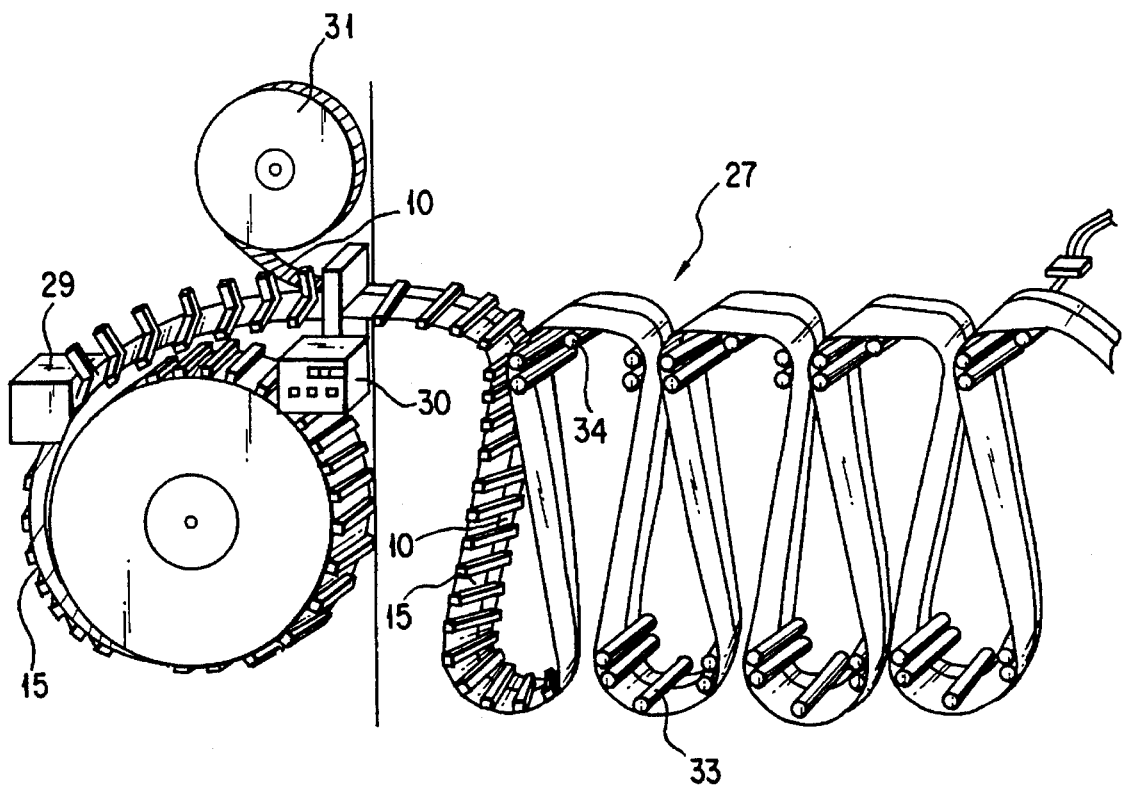
F I G. 9

SEMICONDUCTOR DEVICE BURN-IN APPARATUS

BACKGROUND OF THE INVENTION

1. Field of the Invention

The present invention relates to a semiconductor device burn-in apparatus, wherein a plurality of TAB (Tape Automated Bonding) products, which are arranged on a film in succession and on which semiconductor devices are mounted respectively, and a flexible tape-like wiring board are juxtaposed, the TAB products and the wiring board are fixed by sockets so that they are electrically connected in units of a TAB product, and the TAB products, with the sockets being mounted thereon, are subjected to a burn-in process in the form of elongated members wound in reels.

2. Description of the Related Art

In the prior art, in a burn-in process, TAB products on which semiconductor devices are mounted are subjected to an environment test, e.g. a high-temperature resistance test, in the power-on state. As is shown in FIG. 1, the burn-in process is performed on a structure in which sockets 3 are provided to correspond respectively to semiconductor devices on a plurality of TAB products 2 arranged on a plate-like wiring board 1. These sockets 3 are electrically connected to electrically conductive wiring patterns 4. The sockets 3 are further connected via a connector 5 to an external power supply line, a ground line and a signal line.

The conventional burn-in process is performed after the wiring board 1 is cut into strips at predetermined length.

However, while the wiring board 1 is being cut into strips, the wiring patterns 4 provided on the wiring board 1 may come into contact with a worker or a jig, resulting in deformation, occurrence of static electricity, physical or electrical destruction, or deterioration in reliability of the devices.

If the interval of the TAB products provided on the wiring board 1 is short, TAB products at the cutting areas may be cut.

Three Jap. Pat. Appln. KOKAI Publications Nos. 61-185949, 2-45949 and 2-266275 show prior-art techniques for performing burning processes in the state in which semiconductor devices are mounted on elongated members. In these techniques, however, portions for power supply, grounding and signal supply need to be added to tape patterns in order to perform the burn-in process. This contradicts the reduction in size and cost of products.

On the other hand, in the technique shown in Jap. Pat. Appln. KOKAI Publication No. 4-130279, the size of a TAB product is not so great, but the size of the entire apparatus is great. Thus, it is not possible to perform the burn-in for one reel (24 m) without cutting it.

In the prior art, sockets with specified sizes in accordance with the sizes of associated individual TAB products are employed and fixed on the wiring board 1. Thus, if the interval of the TAB products varies, the sockets need to be changed on all such occasions and cannot be applied to various types of TAB products.

Moreover, a process of cutting and dividing TAB products provided on the wiring board 1 is difficult to automate and is time-consuming.

SUMMARY OF THE INVENTION

The present invention has been made in consideration of the above circumstances, and its object is to provide a semiconductor device burn-in apparatus wherein a plurality of TAB products arranged on a film in succession and each having a semiconductor device thereon, and a flexible tape-like wiring board are juxtaposed, the TAB products and the wiring board are fixed by sockets and electrically connected in units of one of the TAB products, and the TAB products, with the sockets being mounted thereon, are subjected to a burn-in process in the form of elongated members wound in reels.

In order to achieve the object, there is provided a semiconductor device burn-in apparatus comprising: sockets for detachably clamping a film on which a plurality of TAB products, each having a semiconductor device thereon, are arranged in succession and a flexible tape-like wiring board which is situated in the same plane as, and in parallel to, the film and on which electrically conductive wiring patterns are formed, in units of one of the TAB products, and electrically connecting the film and the tape-like wiring board; and storage means for storing the film, the tape-like wiring board and the socket as a combined structure having an elongated shape, and subjecting the combined structure to a burn-in process.

According to the semiconductor device burn-in apparatus with the above structure, the TAB products are not separated by cutting, and the TAB products are subjected to a burn-in process in the form of elongated members wound in reels. Therefore, it is possible to prevent deformation of the TAB products, occurrence of static electricity, and physical or electrical destruction. In addition, the reliability of the products can be enhanced.

Even if the interval between the TAB products provided on the wiring board 1 is short, the TAB products at the cutting areas are not cut and the yield is enhanced.

The socket used in the present invention is independently formed. Thus, in accordance with the size of the TAB product or the interval of the TAB products, the socket can be removed and the position for clamping the TAB product may be changed. Thereby, the socket can be applied to various types TAB products.

Since the TAB products are subjected to the burn-in process in the reel form, the socket can automatically be engaged/disengaged, stored in the constant-temperature bath, and taken out from the bath.

By using the sockets of the present invention, the increase in size of the TAB products due to the need to provide components for the burn-in process can be prevented. Moreover, since the flexible tape-like wiring board is used, the increase in size of the apparatus can be prevented, and one reel of TAB products can be subjected to the burn-in process at a time.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows the arrangement of sockets for TAB products provided on a wiring board and electrically conductive wiring patterns, which are subjected to a prior-art burn-in process;

FIG. 2 illustrates the mounting state of a semiconductor device burn-in apparatus of the present invention in a burn-in process;

FIG. 3 illustrates a unit structure of a TAB product of the present invention;

FIG. 4 shows a part of the upper surface of a flexible tape-like wiring board on which wiring patterns according to the present invention is formed;

FIG. 8 shows the state in which a film on which a plurality of TAB products are arranged in succession and a flexible tape-like wiring board are mounted on the socket in the burn-in apparatus of the present invention; and FIG. 9 shows schematically the structure of a burn-in apparatus according to another embodiment of the present invention.

DETAILED DESCRIPTION OF THE PREFERRED EMBODIMENTS

Figure 5:
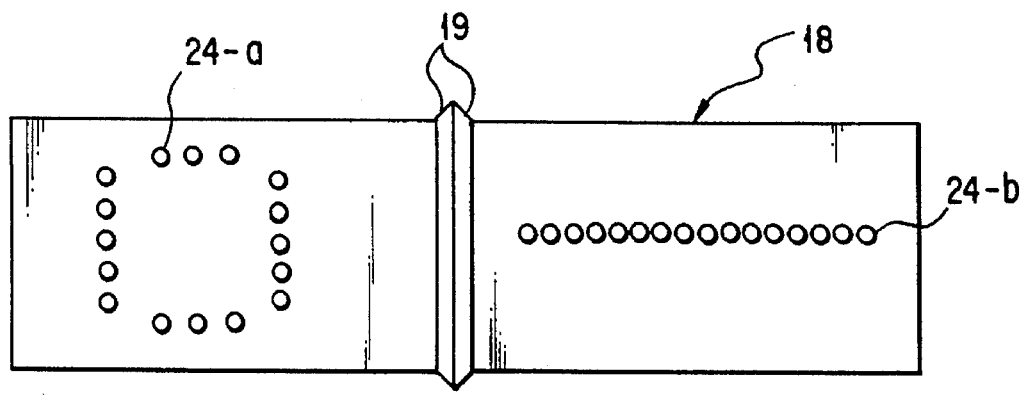
FIG. 5 is a plan view of a socket of the present invention.

An embodiment of the present invention will now be described with reference to the accompanying drawings.

FIG. 2 is a schematic view illustrating the mounting state of a semiconductor device burn-in apparatus according to the present invention. Wiring patterns provided on a flexible tape-like wiring board 15 and TAB products arranged on an elongated film 32 are fixed by sockets 18 so that they are electrically connected. With the sockets 18 being mounted, the flexible tape-like wiring board 15 and the elongated film 32 are wound around a support rod 26 as one unit in an elongated form. The wiring patterns are led to the outside via a connector 28 and are connected to a power supply line, a ground line and a signal line. A plurality of units (seven units in FIG. 2), each comprising TAB units fixed by the sockets 18 and wound in the form of reels, are supported by the single support rod 26. The units can be contained in a constant-temperature bath 27 (shown in cross section) at a time.

FIG. 3 shows a unit structure of the TAB product 10 provided on the film 32. A semiconductor chip 12 mounted on the film 32 is electrically connected to the outside via outer leads 11. FIG. 4 shows the flexible tape-like wiring board 15 which is obtained by processing a multi-layer flexible board formed of, e.g. polyimide resin. Wiring patterns 16 are formed on the wiring board 15 and connected to an external power supply line, an external ground line and a signal line.

Figure 6:
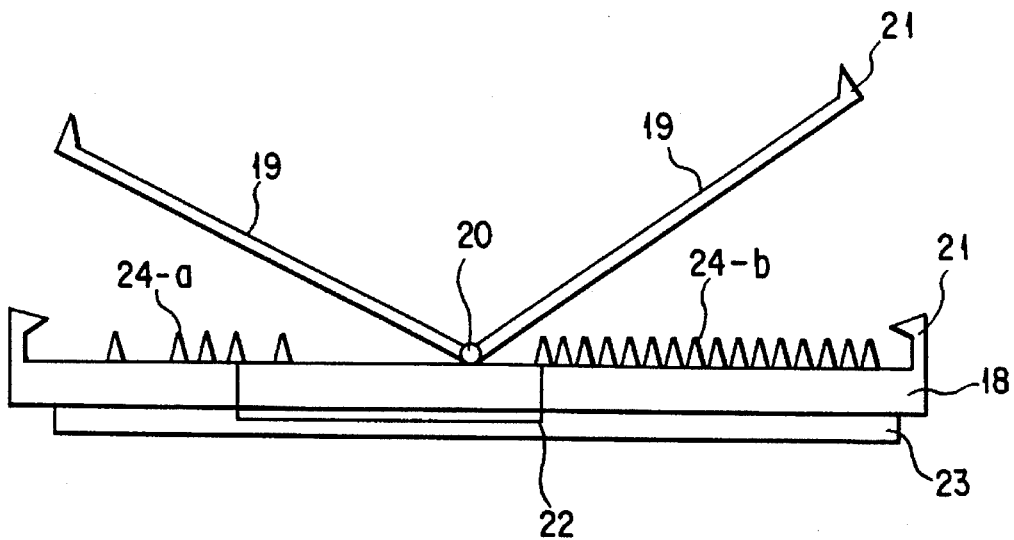
FIG. 6 is a side view of the socket of the invention.
Figure 7:
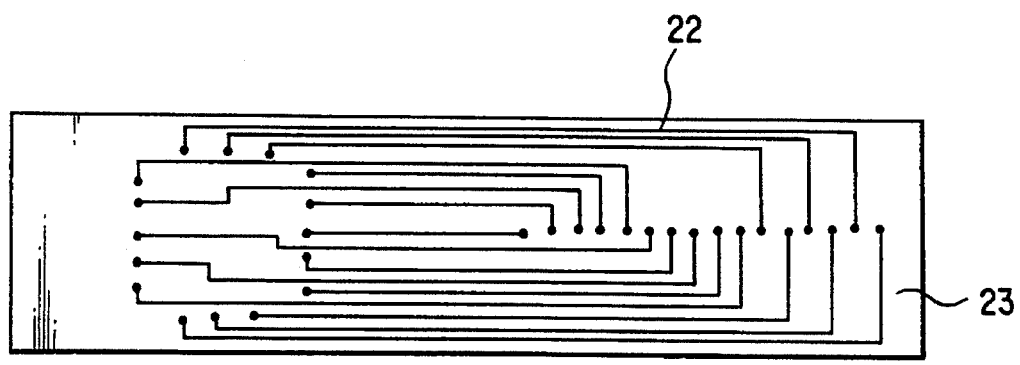
FIG. 7 is a bottom view of the socket of the invention.

FIG. 5 is a plan view of the socket 18 and FIG. 6 is a side view of the socket 18. Pins 24-a for connection with the outer leads 11 of the TAB product 10 are provided on a left part of the socket 18 in respect of a shaft 20 on which holding plates 19 are rotatably supported, as shown in FIG. 6. In addition, pins 24-b for connection with the wiring patterns 16 of the flexible tape-like wiring board 15 are provided on a right part of the socket 18 in respect of the shaft 20. Each holding plate 19 has a claw portion 21 at its distal end portion. The claw portions of the holding plates 19 can be engaged with associated claw portions 21 of the socket 18. The TAB products provided on the film 32 and the associated wiring patterns 16 on the flexible tape-like wiring board 15 are aligned by the engagement of the associated sockets. Thus, the pins 24-a and pins 24-b are electrically connected to the wiring patterns 22. In FIG. 6, the wiring pattern 22 is shown representatively. In fact, a wiring board 23 is attached to the bottom of the socket 18 and the pins 24-a and pins 24-b are connected by the wiring patterns 22, as shown in FIG. 7.

FIG. 8 shows the state before one of the TAB products 10 (the outer lead 11 and semiconductor 12 are shown) and the associated wiring patterns 16 on the flexible tape-like wiring board 15 are fixed by the holding plates 19 of the socket 18. If a non-conductive spacer 25 is provided on the bottom surface of the socket 18, it can serve as a physical and electrical protector when the combined structure of the socket 18, wiring board 15 and film 32 is wound in a reel.

FIG. 9 shows another embodiment of the present invention, wherein the weight of the sockets, TAB products, wiring board, etc. in the step of feeding the combined structure to a constant-temperature both 27 is divided, and an unnecessary external force acting on TAB products is avoided. Specifically, the flexible tape-like wiring board 15 provided with sockets is wound in a reel in advance. When the wiring board 15 is pulled out, the TAB product-side holding plates 19 of the sockets 18 are disengaged by an automatic socket engaging/disengaging unit 29 and are erected. On the other hand, the film 32 wound in a reel is pulled out and the TAB products on the film 32 are juxtaposed with the already pulled-out take-like wiring board 15. Then, the erected holding plates 19 are pressed down and engaged by another automatic engaging/disengaging device 30.

Thus, the TAB products fixed by the sockets are led into the constant-temperature bath 27, stored in a zig-zag manner, and subjected to the burn-in process. Therefore, the thermal efficiency is enhanced and a uniform temperature distribution is obtained.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device burn-in apparatus comprising:

sockets for detachably clamping a film on which a plurality of TAB products, each having a semiconductor device thereon, are arranged in succession and a flexible tape-like wiring board which is situated in the same plane as, and in parallel to, said film and on which electrically conductive wiring patterns are formed, in units of one of said TAB products, and for electrically connecting said film and said tape-like wiring board; and storage means for storing said film, said tape-like wiring board and said socket as a combined structure having an elongated shape, and subjecting said combined structure to a burn-in process.

2. The burn-in apparatus according to claim 1, wherein each of said sockets includes:

a first group of pins to be connected to outer leads of an associated one of said TAB products;

a second group of pins provided on said flexible tape-like wiring board;

a first holding plate for detachably holding said film placed on said first group of pins such that said associated one of said TAB products is electrically connected to said first group of pins;

a second holding plate for detachably holding said flexible tape-like wiring board placed on said second group of pins such that said wiring pattern is electrically connected to said second group of pins; and a wiring board on which wiring patterns for electrically connecting said first group of pins and said second group of pins are formed.

3. The burn-in apparatus according to claim 1, wherein said storage means is a constant-temperature bath.

* * * * *